(12) United States Patent
Voegeli et al.

(10) Patent No.: US 8,686,478 B2
(45) Date of Patent: Apr. 1, 2014

(54) METHODS OF FORMING AND PROGRAMMING AN ELECTRONICALLY PROGRAMMABLE RESISTOR

(75) Inventors: Benjamin T. Voegeli, Burlington, VT (US); Kimball M. Watson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 101 days.

(21) Appl. No.: 13/295,392

(22) Filed: Nov. 14, 2011

(65) Prior Publication Data

US 2012/0058611 A1  Mar. 8, 2012

Related U.S. Application Data

(62) Division of application No. 11/550,450, filed on Oct. 18, 2006, now Pat. No. 8,125,019.

(51) Int. Cl.
*H01L 21/336* (2006.01)

(52) U.S. Cl.
USPC ............ 257/218; 257/324; 257/363; 257/360

(58) Field of Classification Search
USPC .................... 257/218, 324, 360, 363
See application file for complete search history.

(56) References Cited

U.S. PATENT DOCUMENTS

| | | | |
|---|---|---|---|
| 5,679,275 A | 10/1997 | Spraggins et al. | |
| 6,207,978 B1 | 3/2001 | Fastow | |
| 6,306,718 B1 | 10/2001 | Singh et al. | |
| 6,452,478 B1 | 9/2002 | Dale | |
| 6,730,984 B1 | 5/2004 | Ballantine et al. | |
| 6,768,165 B1 * | 7/2004 | Eitan | 257/324 |
| 6,853,582 B1 * | 2/2005 | Matsuda et al. | 365/185.18 |
| 6,862,799 B2 | 3/2005 | Ballantine et al. | |
| 6,958,523 B2 | 10/2005 | Babcock et al. | |
| 6,960,744 B2 | 11/2005 | Adkisson et al. | |
| 2003/0199142 A1 | 10/2003 | Huang | |
| 2004/0233724 A1 | 11/2004 | Shibata et al. | |
| 2004/0239477 A1 | 12/2004 | Landsberger et al. | |
| 2005/0062583 A1 | 3/2005 | Naumov et al. | |
| 2006/0067125 A1 | 3/2006 | Lue | |
| 2006/0133146 A1 * | 6/2006 | Maekawa et al. | 365/185.14 |
| 2006/0145244 A1 * | 7/2006 | Kwon | 257/317 |
| 2006/0279995 A1 | 12/2006 | Matsuda et al. | |
| 2007/0075352 A1 | 4/2007 | Irie | |
| 2008/0093659 A1 | 4/2008 | Voegeli et al. | |

OTHER PUBLICATIONS

U.S. Appl. No. 11/550,450, filed Oct. 18, 2006, Notice of Allowance and Fees Due dated Oct. 24, 2011.
U.S. Appl. No. 11/550,450, filed Oct. 18, 2006, Office Action dated May 12, 2011.

(Continued)

*Primary Examiner* — Daniel Whalen
*Assistant Examiner* — Suberr Chi
(74) *Attorney, Agent, or Firm* — Anthony J. Canale; Hoffman Warnick LLC

(57) ABSTRACT

Methods of electrically programming a diffusion resistor by using trapped charge in a trapped charge region adjacent to the resistor to vary the resistance of the resistor, and the resistor, are disclosed. In one embodiment, a method includes forming a diffusion resistor in a substrate; forming a trapped charge region adjacent to the diffusion resistor; and adjusting a resistance of the diffusion resistor by controlling the trapped charge in the trapped charge region.

19 Claims, 3 Drawing Sheets

(56) References Cited

OTHER PUBLICATIONS

U.S. Appl. No. 11/550,450, filed Oct. 18, 2006, Office Action dated Sep. 2, 2010.
U.S. Appl. No. 11/550,450, filed Oct. 18, 2006, Office Action dated Mar. 19, 2010.
U.S. Appl. No. 11/550,450, filed Oct. 18, 2006, Office Action dated Oct. 26, 2009.
U.S. Appl. No. 11/550,450, filed Oct. 18, 2006, Office Action dated Mar. 19, 2009.
U.S. Appl. No. 11/550,450, filed Oct. 18, 2006, Office Action dated Sep. 4, 2008.
U.S. Appl. No. 11/550,450, filed Oct. 18, 2006, Office Action dated Mar. 19, 2008.

* cited by examiner

METHODS OF FORMING AND PROGRAMMING AN ELECTRONICALLY PROGRAMMABLE RESISTOR

CROSS-REFERENCE TO RELATED APPLICATIONS

This application is a divisional of co-pending U.S. patent application Ser. No. 11/550,450.

BACKGROUND

1. Technical Field

The invention relates generally to integrated circuit (IC) fabrication, and more particularly, to an electrically programmable diffusion resistor and methods of forming the same.

2. Background Art

Conventional bipolar complementary metal oxide semiconductor (BiCMOS) integrated circuits often require resistors with very high precision. For example, existing BiCMOS technologies generally offer resistors with 15-20% tolerance. Resistor tolerances down to approximately 10% are also available in BiCMOS technologies, but require increased cost and process complexity.

One approach to provide high precision resistors (for example, in III-V (gallium arsenic (GaAs), indium phosphorous (InP), etc) technologies) uses a laser to remove materials from the resistor, thus increasing the resistance value. The trimming continues with the integrated circuit being tested until the required resistance is obtained. Tolerances down to 0.1% may be achieved using this approach. Unfortunately, this method is extremely costly and impractical for a volume production BiCMOS technology.

In another approach, electrically programmable fuses are implemented that can be used to selectively eliminate portions of resistor banks to achieve tighter resistor tolerances. This approach does not require additional masking steps, but requires a large area due to the size of the resistor bank structures, as well as the associated circuitry and pads required for programming. This increased size adds cost by increasing required chip area. In addition, there are parasitic effects associated with the large resistor banks. Finally, only finite adjustments can be made using the fuse trimming technique.

SUMMARY OF THE INVENTION

Methods of electrically programming a diffusion resistor by using trapped charge in a trapped charge region adjacent to the resistor to vary the resistance of the resistor, and the resistor, are disclosed. In one embodiment, a method includes forming a diffusion resistor in a substrate; forming a trapped charge region adjacent to the diffusion resistor; and adjusting a resistance of the diffusion resistor by controlling the trapped charge in the trapped charge region.

A first aspect of the invention provides a method comprising: forming a diffusion resistor in a substrate; forming a trapped charge region adjacent to the diffusion resistor; and adjusting a resistance of the diffusion resistor by controlling a trapped charge in the trapped charge region.

A second aspect of the invention provides a method comprising: forming a diffusion resistor in a substrate; and electrically programming a resistance of the diffusion resistor by controlling a trapped charge in a trapped charge region adjacent to the diffusion resistor.

A third aspect of the invention provides a resistor comprising: a doped body within a substrate; a trapped charge region adjacent to the doped body, wherein an amount of trapped charge in the trapped charge region controls a resistance of the doped body.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
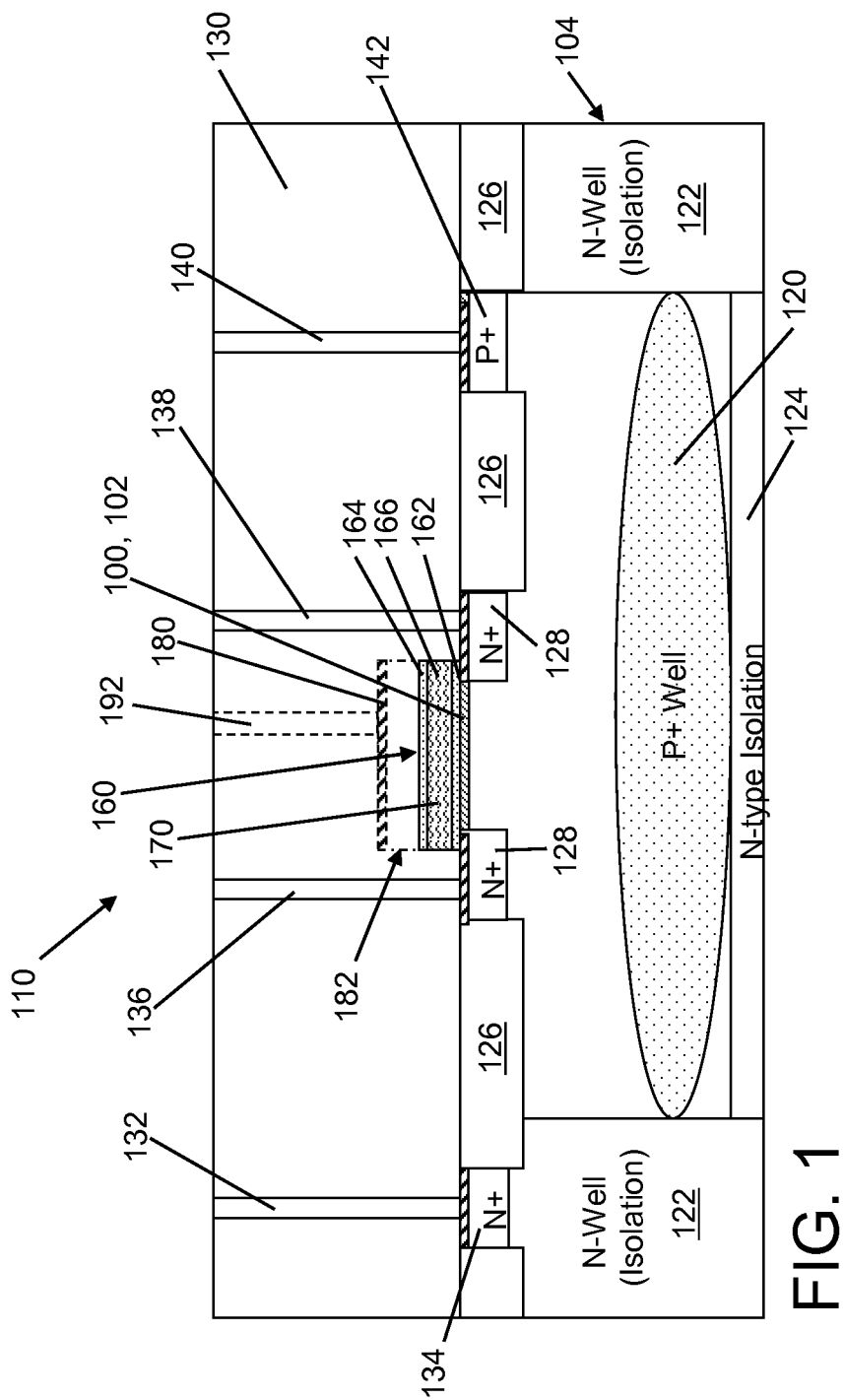
FIG. 1 shows one embodiment of a method and diffusion resistor according to the invention.

Turning to FIG. 1, one embodiment of a method of programming a resistance of a diffusion resistor 100 will be described. In one embodiment, diffusion resistor 100 is formed in a substrate 104 as part of a semiconductor device 110. In one embodiment, diffusion resistor 100 includes an n-type doped body 102 of substrate 104. Substrate 104 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1-Y2+Y3+Y4=1 (1 being the total relative mole quantity). Other suitable substrates 104 include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Diffusion resistor 100 and the rest of device 110 may be physically formed using any now known techniques, e.g., deposition, photolithography, ion implantation of dopants or in-situ doping of substrate 104, etc. FIG. 1 shows other structures of device 110. For example, substrate 104 may be doped p-type below diffusion resistor 100 to include a P+ well 120. Other structures of device 110 may include, for example, n-well isolations 122, N+ isolation 124, shallow trench isolations (STI) 126 and N+ source drain regions 128. An interlayer dielectric (ILD) 130 extends over device 110. A contact 132 extends through ILD 130 to an N+ region 134 coupled to one n-well isolation 122 (left side), contacts 136, 138 extend through ILD 130 to N+ source drain regions 128, and a contact 140 extends through ILD 130 to a P+ region 142 coupled to P+ well 120. N-well isolations 122, N+ isolation 124, N+ region 134 and contact 132 may be omitted in some cases. ILD 130 may include any common dielectric such as silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), etc. N-type dopants may include but are not limited to: phosphorous (P), arsenic (As), antimony (Sb). N-type dopant may include any element introduced to a semiconductor to generate free electron (by "donating" electron to semiconductor), and must have one more valance electron than the semiconductor. P-type dopant may include but are not limited to: boron (B), indium (In) and gallium (Ga). P-type dopant may include any element introduced to a semiconductor to generate free hole (by "accepting" electron from semiconductor atom and "releasing" hole at the same time), and must have an acceptor atom having one valence electron less than the host semiconductor.

Figure 2:
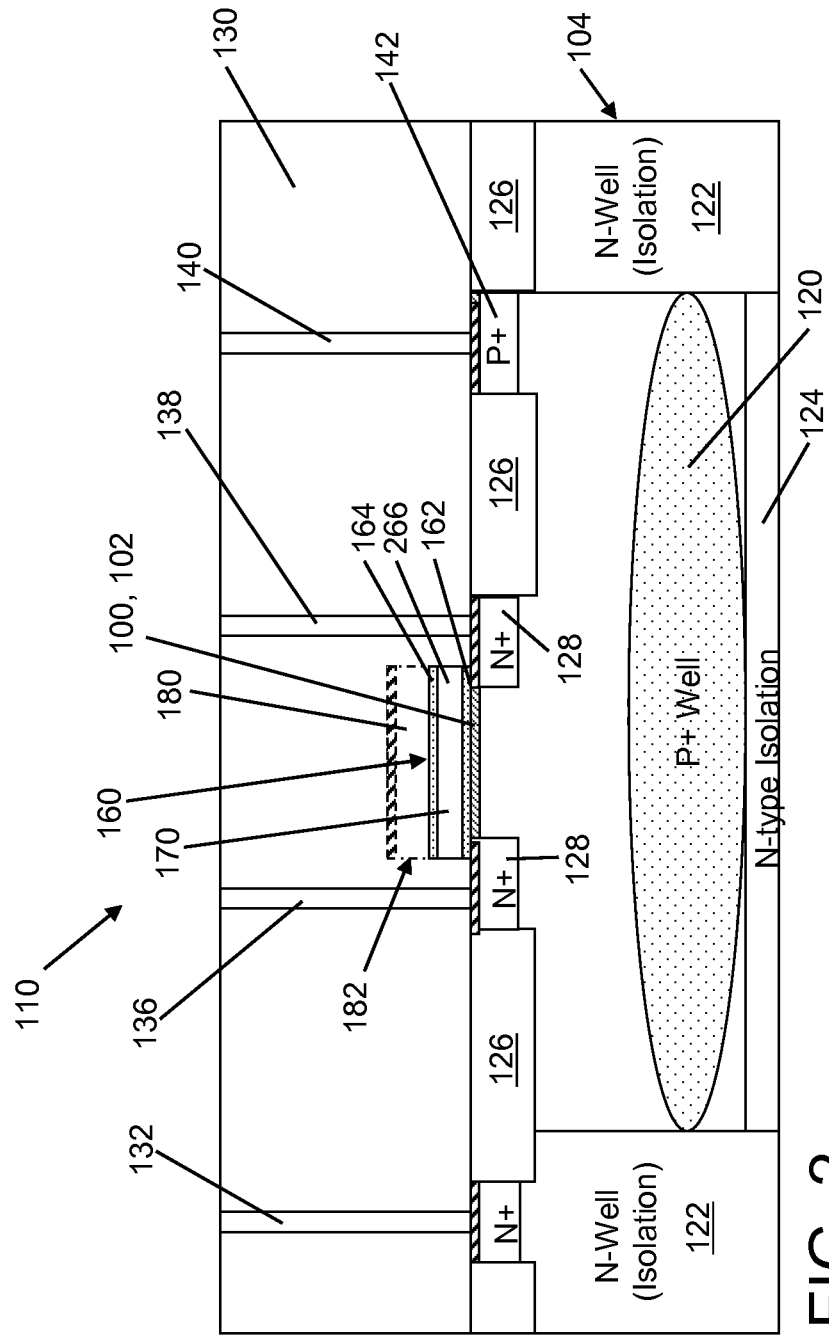
FIG. 2 shows an alternative embodiment of a method and diffusion resistor according to the invention.

A trapped charge region 160 is formed adjacent to diffusion resistor 100. In one embodiment, trapped charge region 160 includes a trapped charge layer (three shown) including at least one of silicon nitride ($Si_3N_4$) and silicon oxide ($SiO_2$). In one particular embodiment, trapped charge region 160 includes a pair of silicon oxide ($SiO_2$) layers 162, 164 having a silicon nitride ($Si_3N_4$) layer 166 therebetween. In an alternative embodiment, the upper silicon oxide ($SiO_2$) layer 164 may be omitted. As will be described in greater detail herein, a trapped charge 170 may be located within silicon nitride ($Si_3N_4$) layer 166. FIG. 2 shows an alternative embodiment in which trapped charge region 160 includes a polysilicon layer 266, e.g., polysilicon, polysilicon germanium, etc. Polysilicon layer 266 may be positioned between upper silicon oxide ($SiO_2$) layer 164 and lower silicon oxide ($SiO_2$) layer 162.

Figure 3:
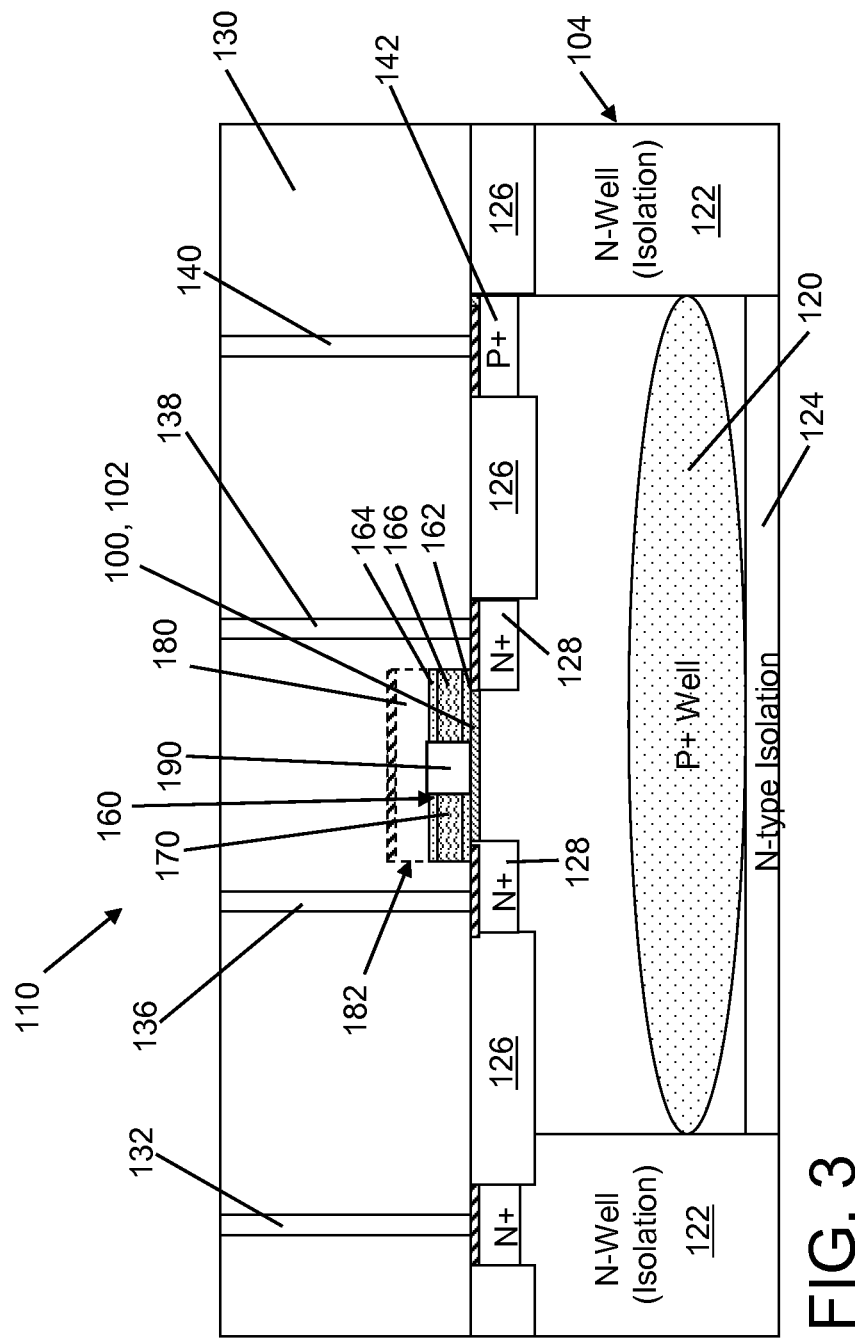
FIG. 3 shows another alternative embodiment of a method and diffusion resistor according to the invention.

As shown in FIGS. 1 and 3, an optional gate layer 180 (shown in phantom) may be formed over an upper one of silicon oxide layers 164, or silicon nitride ($Si_3N_4$) layer 166 where upper silicon oxide ($SiO_2$) layer 164 is omitted. Gate layer 180 may include, but is not limited to, polycrystalline silicon germanium (SiGe), polycrystalline silicon (Si), silicon, germanium, silicon germanium (SiGe), a metal such as tungsten, aluminum, etc. Patterning gate layer 180, one or both of silicon oxide ($SiO_2$) layers 162, 164 and silicon nitride ($Si_3N_4$) layer 166 may be provided to arrive at a gate structure 182. However, this may not be necessary in all cases.

A resistance of diffusion resistor 100 may be electrically programmed and/or adjusted by controlling an amount of trapped charge 170 in trapped charge region 160. In the embodiment shown, in which substrate 104 is doped p-type, diffusion resistor 100 is doped n-type, trapped charge 170 includes electrons. In some instances, however, trapped charge 170 may include holes, rather than electrons. In this case, diffusion resistor 100 is initially formed with the resistance set at a value lower than a target resistance to be achieved by the adjusting. Subsequently, trapped charge region 160 forming may include applying a reverse bias across P+ well 120 to diffusion resistor 100 (via contacts 136, 138 to N+ regions 128 and contact 140 to P+ region 142) to accelerate electrons into trapped charge region 160, i.e., silicon nitride layer 166 (FIGS. 1 and 3) or polysilicon layer 266 (FIG. 2). As a result, trapped charge (electrons) 170 attracts positive charge in doped body 102, which increases the effective resistance of diffusion resistor 100. A forward bias may also be applied across P+ well 120 to N-type Isolation 124 (via contact 140 to P+ region 142 and contact 132 to N-Well region 122), which provides additional carriers to be accelerated into the trapped charge region 160 by the reverse bias across P+ well 120 to diffusion resistor 100. Controlling the amount of trapped charge 170 allows for electrically programming the resistance of diffusion resistor 100. Models and formulas can be developed to relate voltage, current and time to the resulting increase in resistance. The application of the above-described biases (e.g., 1-16V) can change the resistance in very little time, e.g., seconds, compared to conventional techniques. The above-described methodology can be performed at practically any time, e.g., during manufacture, in the field or during testing.

The resulting diffusion resistor 100 includes a doped body 102 within substrate 104, trapped charge region 160 adjacent to doped body 102, wherein an amount of trapped charge 170 in trapped charge region 160 controls a resistance of doped body 102. As noted above, in one embodiment, trapped charge region 160 may include at least one of silicon oxide ($SiO_2$) and silicon nitride ($Si_3N_4$). In one embodiment, trapped charge region 160 may include a pair of silicon oxide ($SiO_2$) layers 162, 164 having silicon nitride ($Si_3N_4$) layer 166 therebetween with trapped charge 170 located within silicon nitride layer 166, or may include silicon oxide ($SiO_2$) layer 162 and silicon nitride ($Si_3N_4$) layer 166. In an alternative embodiment, shown in FIG. 2, trapped charge region 160 may include a polysilicon layer 266. As shown in FIGS. 1 and 3, gate layer 180 may be positioned over an upper one 164 of silicon oxide ($SiO_2$) layers 162, 164, or silicon nitride ($Si_3N_4$) layer 166 where upper silicon oxide ($SiO_2$) layer 164 is omitted. As also shown in FIG. 3, in an alternative embodiment, a contact 190 may be provided coupling gate layer 180 to diffusion resistor 100. In another alternative embodiment, as shown in phantom in FIG. 1, an additional contact 192 may be applied to gate region 180 in order to allow electrical biasing of gate region 180.

It is understood that while the above-described embodiment has been described using certain doping scheme, the teachings of the invention are applicable to an opposite doping scheme also.

The methods and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multi-chip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method comprising:
    forming a diffusion resistor in a substrate, the diffusion resistor including a single doped body,
    wherein the substrate includes a p-type doped substrate region and wherein the single doped body is doped n-type during the forming;
    forming a trapped charge region adjacent to and in direct contact with the single doped body, the forming of the trapped charge region including forming the trapped charge region such that the single doped body is substantially parallel with the trapped charge region and the single doped body substantially separates the trapped charge region from the substrate; and adjusting a resistance of the diffusion resistor by controlling a trapped charge in the trapped charge region by varying an amount of trapped charge in the trapped charge region.

2. The method of claim 1, wherein the trapped charge region forming includes forming a pair of silicon oxide layers having a silicon nitride layer therebetween, wherein the trapped charge is located within the silicon nitride layer.

3. The method of claim 2, further comprising forming a gate layer over an upper one of the silicon oxide layers, and patterning the gate layer, the pair of silicon oxide layers and the silicon nitride layers into a gate structure.

4. The method of claim 1, wherein the trapped charge region forming includes forming a trapped charge layer including at least one of silicon nitride and silicon oxide.

5. The method of claim 1, wherein the trapped charge region forming includes forming a polysilicon layer, wherein the trapped charge is located within the polysilicon layer.

6. The method of claim 1, wherein the forming includes setting the resistance at a value lower than a target resistance to be achieved by the adjusting.

7. The method of claim 1, wherein the substrate includes an n-type isolation below the trapped charge region, and wherein the trapped charge region forming includes applying a forward bias across the p-type doped substrate region to the n-type isolation and a reverse bias across the p-type doped substrate region to the diffusion resistor to accelerate the electrons into the trapped charge region.

8. The method of claim 1, wherein the trapped charge region forming includes applying a reverse bias across the p-type doped substrate region to the diffusion resistor to accelerate electrons into the trapped charge region.

9. The method of claim 8, wherein the substrate includes an n-type isolation below the trapped charge region, and wherein the trapped charge region forming further includes applying a forward bias across the p-type doped substrate region to the n-type isolation to provide electrons for acceleration into the trapped charge region.

10. A method comprising:

forming a diffusion resistor in a substrate, the diffusion resistor including a single doped body, the substrate including a p-type doped substrate region and the single doped body being doped n-type;

forming a trapped charge region adjacent to and in direct contact with the single doped body such that the single doped body is substantially parallel with the trapped charge region, the single doped body being formed to substantially separate the trapped charge region from the substrate; and electrically programming a resistance of the diffusion resistor by controlling an amount of trapped charge in the trapped charge region.

11. The method of claim 10, wherein the trapped charged region includes a pair of silicon oxide layers having a silicon nitride layer therebetween, wherein the trapped charge is located within the silicon nitride layer.

12. The method of claim 11, further comprising forming a gate layer over an upper one of the silicon oxide layers, and patterning the gate layer, the pair of silicon oxide layers and the silicon nitride layers into a gate structure.

13. The method of claim 10, further comprising forming the trapped charge region by forming a trapped charge layer including at least one of silicon nitride and silicon oxide.

14. The method of claim 10, further comprising forming the trapped charge region by forming a polysilicon layer, wherein the trapped charge is located within the polysilicon layer.

15. The method of claim 10, wherein the forming includes setting the resistance at a value lower than a target resistance to be achieved by the programming.

16. The method of claim 10, further comprising forming the trapped charge region by applying a reverse bias across the p-type doped substrate region to the diffusion resistor to accelerate electrons into the trapped charge region.

17. The method of claim 16, wherein the substrate includes an n-type isolation below the trapped charge region, and wherein the trapped charge region forming further includes applying a forward bias across the p-type doped substrate region to the n-type isolation to provide electrons for acceleration into the trapped charge region.

18. The method of claim 1, wherein single doped body is permanently doped independent of the amount of trapped charge in the trapped charge region.

19. The method of claim 10, wherein single doped body is permanently doped independent of the amount of trapped charge in the trapped charge region.

* * * * *